United States Patent
Hook et al.

(10) Patent No.: US 9,997,607 B2
(45) Date of Patent: Jun. 12, 2018

(54) MIRRORED CONTACT CMOS WITH SELF-ALIGNED SOURCE, DRAIN, AND BACK-GATE

(71) Applicant: INTERNATIONAL BUSINESS MACHINES CORPORATION, Armonk, NY (US)

(72) Inventors: Terence B. Hook, Jericho, VT (US); Joshua M. Rubin, Albany, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 35 days.

(21) Appl. No.: 15/198,422

(22) Filed: Jun. 30, 2016

(65) Prior Publication Data
US 2018/0006126 A1    Jan. 4, 2018

(51) Int. Cl.
H01L 29/423    (2006.01)
H01L 29/786    (2006.01)
H01L 29/417    (2006.01)
H01L 29/66    (2006.01)
H01L 21/762    (2006.01)

(52) U.S. Cl.
CPC .. H01L 29/42356 (2013.01); H01L 21/76251 (2013.01); H01L 29/4175 (2013.01); H01L 29/66772 (2013.01); H01L 29/78654 (2013.01)

(58) Field of Classification Search
CPC ........ H01L 29/42356; H01L 21/76251; H01L 29/4175; H01L 29/66772; H01L 29/78654
USPC ....................................................... 257/347
See application file for complete search history.

(56) References Cited

U.S. PATENT DOCUMENTS

| | | |
|---|---|---|
| 7,285,477 B1 | 10/2007 | Bernstein et al. |
| 7,381,627 B2 | 6/2008 | Bernstein et al. |
| 7,939,914 B2 | 5/2011 | Bernstein et al. |
| 7,960,245 B2 | 6/2011 | Bernstein et al. |
| 8,294,211 B2 | 10/2012 | Yang et al. |
| 9,196,810 B2 | 11/2015 | Odnoblyudov et al. |
| 9,230,861 B2 | 1/2016 | Chetlur et al. |
| 9,318,417 B2 | 4/2016 | Therrien et al. |
| 2007/0296002 A1 | 12/2007 | Liang et al. |
| 2007/0296003 A1 | 12/2007 | Liang et al. |
| 2015/0332966 A1 | 11/2015 | Maling et al. |
| 2016/0071819 A1 | 3/2016 | Fuergut et al. |
| 2016/0093706 A1 | 3/2016 | Brandt et al. |

*Primary Examiner* — Hrayr A Sayadian
(74) *Attorney, Agent, or Firm* — Cantor Colburn LLP; Vazken Alexanian

(57) ABSTRACT

A semiconductor device and method of forming a semiconductor device including an inverted field effect transistor having metal filled front-side source and drain that is self-aligned and in direct contact with a metal filled back-side source and drain, wherein the device includes a metal backgate.

20 Claims, 8 Drawing Sheets

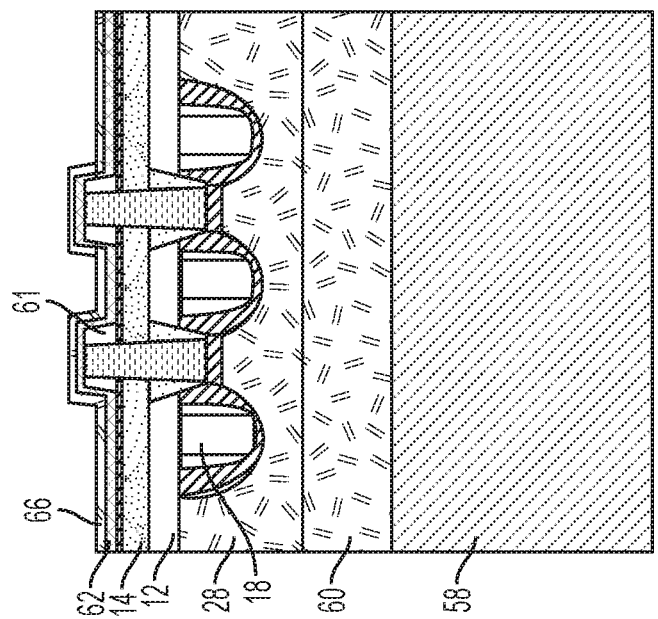
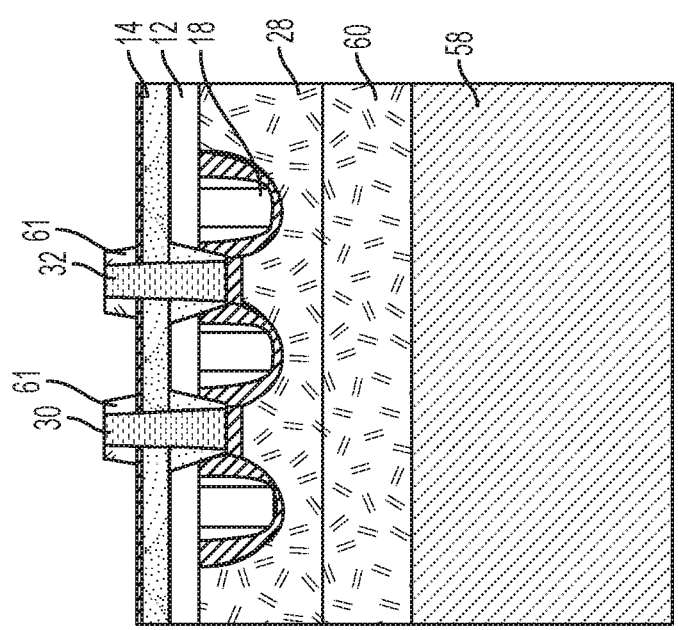

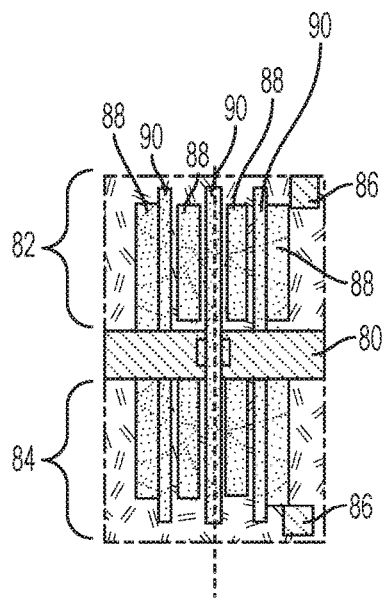
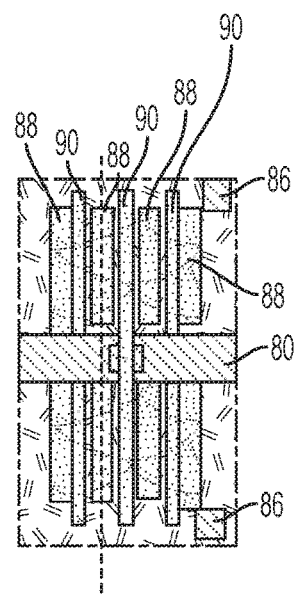
FIG. 14A  FIG. 15A
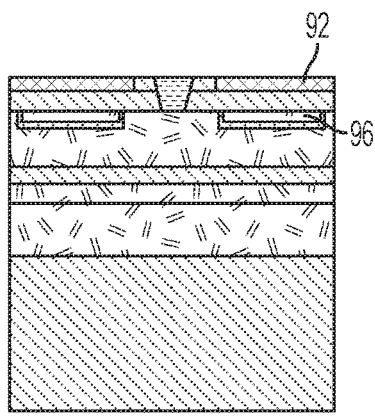
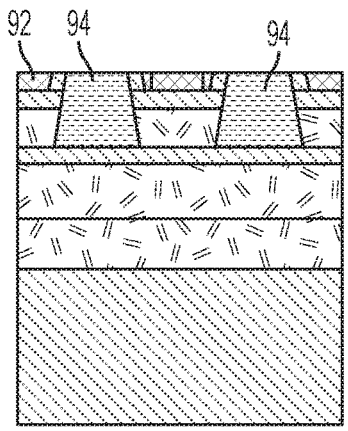
FIG. 14B  FIG. 15B

MIRRORED CONTACT CMOS WITH SELF-ALIGNED SOURCE, DRAIN, AND BACK-GATE

BACKGROUND

The present invention relates to integrated circuit chips, and more specifically, to a design structure for upside-down field effect transistors.

Integrated circuits (ICs) are implemented using a plurality of interconnected field effect transistors (FETs), which can be realized as metal oxide semiconductor field effect transistors (MOSFETs or MOS transistors). The MOS transistor can include both a p-type device and an n-type device, wherein such a device is commonly referred to as a complimentary MOS or CMOS device. A MOS transistor includes a gate electrode as a control electrode that is formed over a semiconductor layer having spaced-apart source and drain regions formed therein. Because of the higher density per unit area of microelectronic devices on a chip, it is a challenge to reduce the parasitic or unwanted capacitance between the gate conductor line and the metal filled vias that form the contacts to the device source and drain.

SUMMARY

According to one embodiment, a semiconductor device is provided. The semiconductor device includes a silicon-on-insulator layer adhered to a buried oxide layer; silicon-on-insulator layer adhered to a buried oxide layer; an optional stress liner deposited over the at least one gate and the buried oxide layer; a first dielectric layer deposited over the stress liner; a handling wafer adhered to the dielectric layer; a front-side source and a front-side drain extending through a portion of the buried oxide layer and silicon-on-insulator layer; a metal back-gate layer applied to the buried oxide layer, wherein the metal back-gate layer is not in contact with the front-side source and the front-side drain; a second dielectric layer deposited on the metal back-gate layer; a back-side source and a back-side drain extending through the second dielectric layer, wherein the back-side source is aligned and in contact with the front-side source, wherein the back-side drain is aligned and in contact with the front-side drain; and a metal back-gate contact extending through the second dielectric layer to a portion of the metal back-gate layer.

According to one embodiment, a method of forming a semiconductor device is provided. The method includes providing a donor substrate including a silicon substrate, a buried oxide, and a single-crystal silicon-on-insulator layer; forming a gate extending from the silicon-on-insulator layer; forming a front-side source and a front-side drain in the donor substrate by etching a portion of the donor substrate and filling the etched regions with a first metal; optionally depositing a stress liner over the gate, the front-side source, and the front-side drain; depositing a first dielectric layer over the stress liner, wherein the exposed surface of the dielectric layer is planarized; adhering the dielectric layer to a handling wafer; selectively removing the donor substrate to expose the buried oxide layer, a portion of the front-side source, and a portion of the front-side drain; depositing a second dielectric layer over the exposed buried oxide layer, the exposed portion of the front-side source, and the exposed portion of the front-side drain; depositing a metal back-gate layer over the second dielectric layer; depositing a third dielectric layer over the metal back-gate layer, the exposed portion of the front-side source, and the exposed portion of the front-side drain; forming a back-side source and a back-side drain in the third dielectric layer, wherein the back-side source is aligned and in contact with the front-side source, wherein the back-side drain is aligned and in contact with the front-side drain; and forming a back-gate metal contact in the third dielectric layer, wherein the back-gate metal contact is in contact with a portion of the back-gate metal layer.

According to one embodiment, a method of forming a transistor device is provided. The method includes providing a donor substrate including a silicon substrate, a buried oxide, and a single-crystal silicon-on-insulator layer; forming a gate extending from the silicon-on-insulator layer; forming a front-side source and a front-side drain in the donor substrate by etching a portion of the donor substrate and filling the etched regions with a first metal; optionally depositing a stress liner over the gate, the front-side source, and the front-side drain; depositing a first dielectric layer over the stress liner, wherein the exposed surface of the dielectric layer is planarized; adhering the first dielectric layer to a handling wafer; selectively removing the donor substrate to expose the buried oxide layer, a portion of the front-side source, and a portion of the front-side drain; depositing a second dielectric layer over the exposed buried oxide layer, the exposed portion of the front-side source, and the exposed portion of the front-side drain; selectively removing the second dielectric layer from contact with the buried oxide layer, a top surface of the front-side source, and a top surface of the front-side drain, wherein the second dielectric layer remains in contact with the exposed side portion of the front-side source and the exposed side portion of front-side drain; depositing a metal back-gate layer over the second dielectric layer; depositing a third dielectric layer over the metal back-gate layer, the exposed portion of the front-side source, and the exposed portion of the front-side drain; forming a back-side source and a back-side drain in the third dielectric layer, wherein the back-side source is aligned and in contact with the front-side source, wherein the back-side drain is aligned and in contact with the front-side drain; and forming a back-gate metal contact in the third dielectric layer, wherein the back-gate metal contact is in contact with a portion of the back-gate metal layer.

BRIEF DESCRIPTION OF THE DRAWINGS

FIGS. 2-9 illustrate an exemplary fabrication process of forming a semiconductor device according to an embodiment, in which:

FIG. 2 illustrates a portion of the semiconductor device according to an embodiment.

FIG. 3 is a cross-sectional view of the semiconductor device illustrating the application of a first dielectric layer over the stress liner according to an embodiment;

FIG. 4 is a cross-sectional view of the semiconductor device illustrating inverting the device and bonding the dielectric layer to a handling wafer;

FIG. 5 is a cross-sectional view of the semiconductor device illustrating the removal of the donor substrate;

FIG. 6 is a cross-sectional view of the semiconductor device illustrating the application of the second dielectric layer on the exposed front-side source and drain;

FIG. 7 is a cross-sectional view of the semiconductor device illustrating the deposition of a metallic back-gate layer, and a subsequent application of an oxide layer on the metallic back-gate layer;

FIG. 8 is a cross-sectional view of the semiconductor device illustrating the planarization of the back-side of the device; and FIG. 9 is a cross-sectional view of the semiconductor device illustrating the production of the back-side source and drain extending and aligned with the front-side source and drain.

FIG. 10 through FIG. 13 illustrate an exemplary portion of a fabrication process of a forming a semiconductor device according to an embodiment, in which:

FIG. 10 is a cross-sectional view of the semiconductor device illustrating the removal of the donor substrate, exposing the front-side source and drain;

FIG. 11 is a cross-sectional view of the semiconductor device illustrating the deposition of a spacer material layer over the buried oxide layer and exposed front-side source and drain;

FIG. 12 is a cross-sectional view of the semiconductor device illustrating the selective removal of the spacer layer, wherein the spacer layer is removed from the buried oxide layer and top surface of the front-side source and drain; and FIG. 13 is a cross-sectional view of the semiconductor device illustrating the deposition of a metallic back-gate layer, and a subsequent application of an oxide layer on the metallic back-gate layer.

FIGS. 14A-15B illustrate an embodiment of a planar device according to an embodiment.

DETAILED DESCRIPTION

Figure 1:
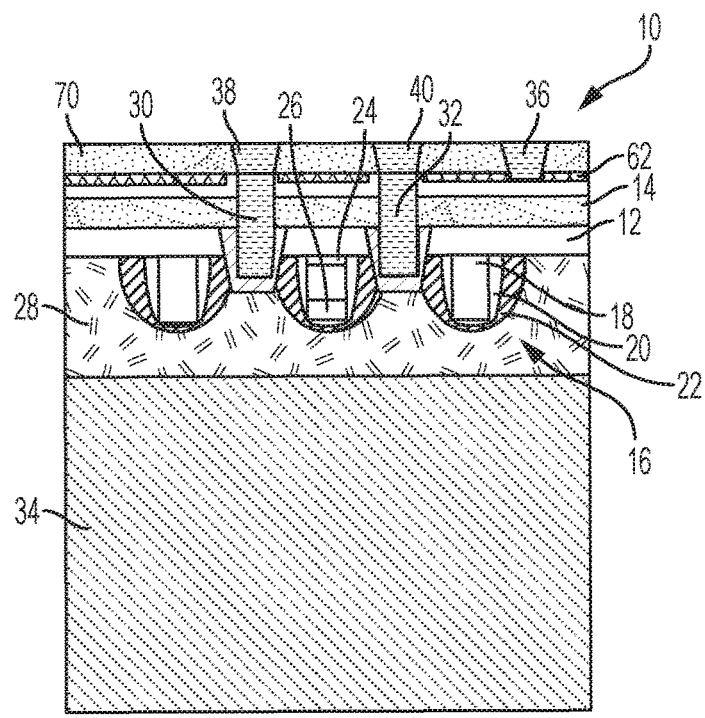
FIG. 1 illustrates a semiconductor device according to an embodiment.

It is understood in advance that, although embodiments of the invention include a detailed description of the formation of and resulting structures for a specific type of FET, implementation of the teachings recited herein are not limited to a particular type of semiconductor device or IC architecture. Rather embodiments of the present invention are capable of being implemented in conjunction with any other type semiconductor device or IC architecture, now known or later developed, as long as the semiconductor device incorporates the essential features described herein.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). In the following invention "front-side" refers to the surface on which the integrated circuit devices are made prior to flipping over the FET, and "back-side" refers to the surface that is to become the top surface after the device is turned over and bonded to a handling wafer.

As previously noted herein, a MOS transistor includes a gate electrode as a control electrode that is formed over a semiconductor layer having spaced-apart source and drain regions formed therein. Current can flow between the source and drain regions, which are typically accessed via respective conductive contacts formed on the source and drain regions. The gate electrode is typically accessed through one or more conductive contacts coupled to a conductive gate contact formed at the upper part of the gate electrode. Bias voltages applied to the gate contact, the source contact, and the drain contact control the flow of current through the channel and between the source and drain regions.

Because of the higher density per unit area of microelectronic devices on a chip, it is a challenge to reduce the parasitic or unwanted capacitance between the gate conductor line and the metal filled vias that form the contacts to the device source and drain. This unwanted capacitance arises because of the close proximity of the metal filled vias and the gate line and can have a negative impact on device speed when the device pitch is small. An upside-down field effect transistor (UFET) is one way to address this challenge. A UFET is able to reduce the capacitance between the gate conductor line and the metal filled vias. An upside-down FET has the additional advantage of maintaining more of the strain induced in the channel by stress liners because the liner is not punctured by the contact via holes.

However, a major issue with known UFET structures is that the back-side contacts to the source and drain are not self-aligned to the source and drain regions of the device. In some UFET configurations, the contact vias are formed by etching through the source and drain silicon to contact the silicide layer. This presents a problem if the contact holes are misaligned. A failure can occur when part of the contact hole extends over a region not silicided, or if the backside contact lands on the device channel thereby shorting the device.

Back gate biasing is a useful method for adaptive power management. Planar fully depleted semiconductor-on-insulator (SOI) devices with a thin buried oxide layer (BOX) can be employed to introduce a back gate bias voltage that can independently control device performance without requiring changes to settings at other device nodes. Conventional schemes that employ back gate electrodes do not provide self-alignment between a back gate electrode and active areas the active areas that are above the back electrode because the back gate electrode is patterned separately from the active areas. Accordingly, it would be beneficial to provide an integration scheme to fabricating a back gate device. Additionally, the self-aligned backgate provides electrostatic shielding of the device channel from the back-side source/drain regions.

Embodiments of the present invention relate to fabrication methods and resulting structures for a FET. A FET is a semiconductor device in which output current, i.e., source-drain current, is controlled by the voltage applied to a gate portion. A FET has three terminals: a gate portion, source, and drain. The gate portion is used to control output current, i.e., flow of carriers in the channel, of a semiconductor device through electrical or magnetic fields. The channel region, which is electrically coupled to the source and drain, becomes conductive when the semiconductor device is turned on. The source region is a doped region from which majority carriers flow into the channel. The drain region is a doped region located on the other side of the channel region. Carriers flowing out of the channel region go into the drain region. The term "raised," as used herein to describe a region (e.g., a raised source/drain (RSD)) that has an upper surface vertically offset and above the upper surface of the semiconductor substrate. A "low-k" material as used herein is a dielectric material with a small dielectric constant relative to the dielectric constant of silicon dioxide ($SiO_2$), which is 3.9. A dielectric constant is represented numerically as the ratio of the permittivity of $SiO_2$ divided by the permittivity of a vacuum.

Turning now to an overview of embodiments of the present invention, one or more embodiments provide a semiconductor device that reduces the parasitic capacitance between the gate conductor line and the metal filled via that forms a contact to the source/drain. The parasitic capacitance is reduced because the metal filled vias in the disclosed device configuration(s) are no longer in proximity to the gate line. In addition, the disclosed device configurations have the ability to maintain more of the strain induced in the source/drain channel by stress liners since the liner is not punctured by the contact via holes. The stress liner is a film that has intrinsic stress when deposited over the device. The stress liner stress induces strain in the channel, wherein the stress is measured as the force per unit area.

Embodiments of the present invention mirror the front source/drain with the back source/drain to reduce extrinsic capacitance. Specifically, after inverting and bonding the front-side to a handle wafer, the back-side of the device can be thinned, thereby revealing the contacts for the back-side source/drain/gate. As a result, significant reduction in capacitance can be achieved, and additional room for the contacts can be obtained. In addition, strain can be maintained in the channel due to the external stressors in the source/drain region. After thinning of the back-side and revealing the source/drain contacts of the front-side, a dielectric layer is applied, and mirrored back-gate source and back-gate drain are produced by etching through a portion of the dielectric to form a channel to the front-side source and drain, wherein the channels are filled with metal. The back-side source and drain are in direct contact and extend from the front-side source and drain.

In one or more embodiments, the source and drain regions contain at least in part a metallic material. These regions are formed by first etching the source and drain regions past the buried oxide (exposing the substrate) and then depositing the metal in the etched regions.

In contrast to systems that use epitaxial growth of SiGe, particularly for the backside source/drain, the present device and process includes source and drains that include metals such as tungsten, cobalt, ruthenium, nickel, titanium, silicide, among others. Epitaxy is a method of depositing a monocrystalline film on a monocrystalline substrate. The deposited film is denoted as an epitaxial layer or epitaxial film. When flipped over, the source and drain regions are not etched when the excess silicon is etched to expose the buried oxide. An epitaxial growth of SiGe can be used for the frontside source/drain regions. The contact holes (vias) are made to contact the back-side silicide. In contrast to the epitaxial method, the present method has the main advantage of resistance: the metal via from frontside to backside will be lower resistance than a device formed using the epitaxial method for the backside source/drain. There can also be an advantage for selectivity in the backside processing whereby it could be easier to preserve the via topography than in an epitaxial method.

Turning now to a more detailed description, FIG. 1 illustrates an example of the semiconductor device 10. The device 10 includes a SOI layer 12 including a buried oxide layer 14 adjacent to the SOI layer 12 according to the known art. Extending from the SOI layer 12 is at least one gate 16 including a gate conductor 18. The gate 16 can include a gate dielectric layer 24 adjacent to the SOI layer 12. In addition, the gate 16 can include a self-aligned silicide layer 26 on the top surface (before inverting) of the gate conductor 16. The gate 16 can include spacers 20 on each side of the gate conductor 18 and a stress liner 22 can be deposited over the gates 16. The semiconductor device 10 includes a first dielectric layer 28 deposited over the stress liner, wherein the first dielectric layer 28 is adhered to a handling wafer 34.

The semiconductor device 10 also includes raised front-side source 30 and front-side drain 32 extending from the SOI layer 12 in the opposite direction than that of the gates 16. The device 10 also includes a back-side source 38 and a back-side drain 40 extending through a second dielectric layer 70, wherein the second dielectric layer 70 is adhered to a metal back-gate layer 62 deposited adjacent to the buried oxide layer 14. The back-side source 38 is substantially aligned and in contact with the front-side source 30, and the back-side drain 40 is substantially aligned and in contact with the front-side drain 32. The back-gate layer 62 can be deposited on a second dielectric layer 61, wherein the second dielectric layer 61 is deposited on the buried oxide layer 14. The device also includes a metal back-gate contact 36 extending from at least a portion of the metal back-gate layer 62 through the third dielectric layer 64. Alternatively, the metal back-gate layer 62 can be deposited directly on the buried oxide layer 14. In an example, the back-side source 38 and the back-side drain 40 are formed in a trapezoidal fashion via etching to provide for greater surface area of the exposed contact surface of both the back-side source 38 and back-side drain 40.

Figure 2:
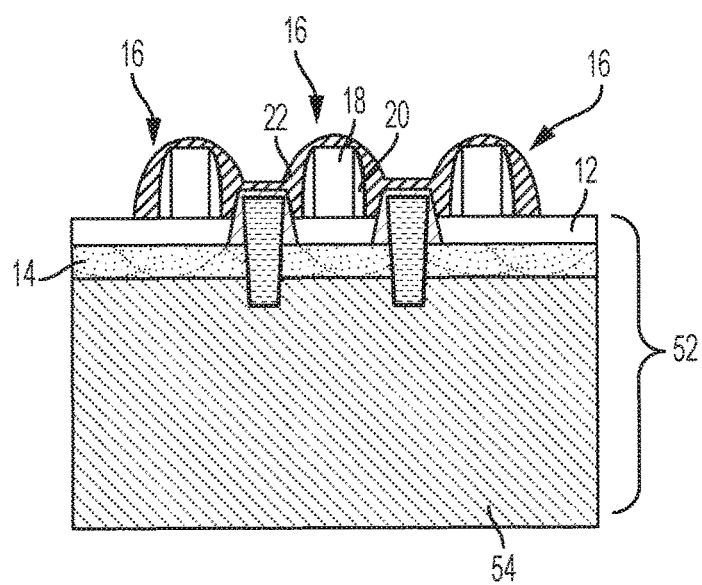

FIG. 2 through FIG. 9 illustrate an exemplary fabrication process of forming a semiconductor device 10 according to an embodiment. Shown in FIG. 2 illustrates a portion of the device including at least one gate 16 fabricated over a silicon-on-insulator (SOI) substrate 52. The SOI substrate 52 includes a silicon substrate 54, a buried oxide 14, and a single crystal SOI layer 12.

The SOI substrate can be fabricated by well-established methods such as SmartCut™ or SIMOX (separation by Implanted Oxygen). The fabrication of the semiconductor device 10 can include forming a thin gate dielectric layer over the SOI layer, forming a gate conductor line over the thin gate dielectric layer, and forming spacers 20 adjacent to the gate conductor line sidewalls. The front-side source and drain regions can be formed by fulling etching the SOI layer 12, including the buried oxide 14, and with some amount of etching of the substrate 54, and then filling up the etched regions with a metal. An optional stress liner 22 can be deposited over the gates 16 to induce additional strain in the device channel, which is beneficial because higher compressive strain leads to higher hole mobility and higher drive current. In conventional flow the stress liner would be interrupted by openings (vias) for contacting the source and drain regions, wherein the openings reduce the strain induced by the stress liner. However, because the disclosed device includes contacts of the source and drain regions from the back-side, the stress liner is not compromised.

The semiconductor substrate 12 can be a silicon containing material. For example, the semiconductor substrate 12 can include Si, SiGe, SiGeC, Si:C, polysilicon, epitaxial Si, amorphous Si, and multi-layers thereof. Although Si is the predominately used semiconductor material in wafer fabrication, other materials can be used including, but not limited to, germanium, gallium arsenide, gallium nitride, cadmium telluride, and zinc selenide.

Figure 3:
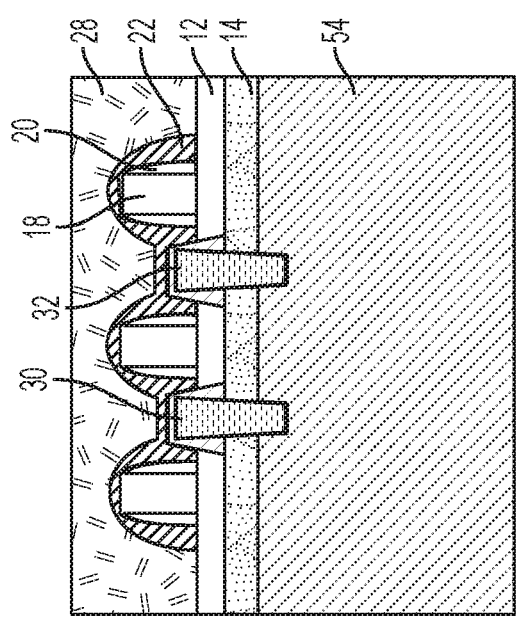

As shown in FIG. 3, the first dielectric layer 28 is blanket deposited over the stress liner 22. The first dielectric layer 28 can be formed of any suitable dielectric material, such as, $SiO_x$, $Si_3N_4$, $SiN_xO_y$, including a low-k dielectric. The dielectric layer 28 can be formed by any suitable deposition process. The top surface of the dielectric film 56 is planarized by a process such as chemical-mechanical polishing (CMP).

Figure 4:
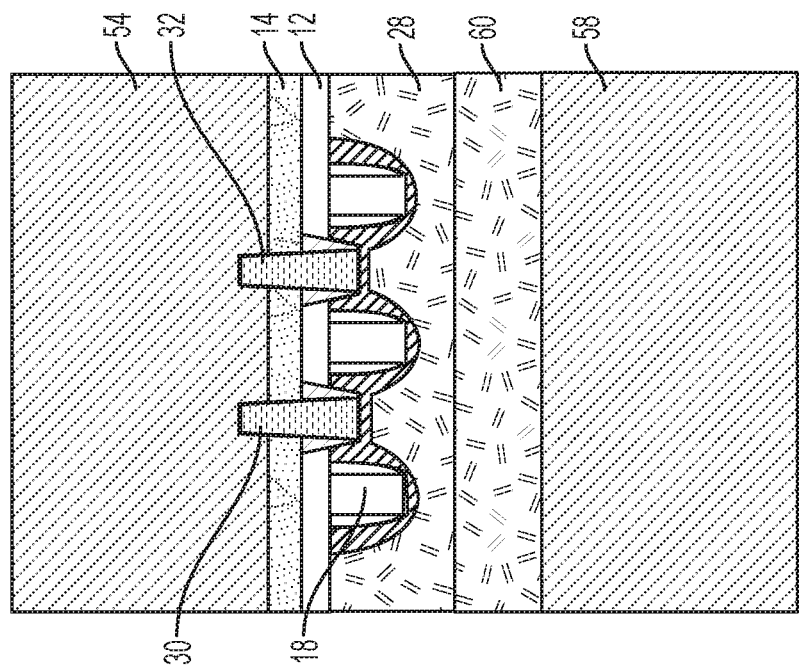

As shown in FIG. 4, the device up to this point is then flipped up-side down and bonded to a handling wafer 58. The handling wafer 58 top surface is typically $SiO_2$ or silicon, but other materials including metals such as copper, allow for adequate bonding at relatively low temperatures. The first dielectric layer 28 can be directly bonded to the handling wafer 58, or a bonding layer 60 can be used to adhere the dielectric layer 28 to the handling wafer 58. The bonding layer 60 can be any film that aids in the bonding of the wafers. For example, the bonding film can include permanent or temporary bonding films, such as SiN, oxides, polymers, among others.

In an example, the bonding of the first dielectric layer 28 to the handling wafer 58 can include, after planarizing the first dielectric layer 28, bringing the handling wafer 58 into contact with the dielectric layer 28, wherein the handling wafer 58 initially bond by van der Waals forces. The handling wafer 58 can be annealed forming covalent bonds between the wafers. Typical annealing temperature is about 400° C. to 500° C., and the annealing time can be greater than an hour up to 24 hours.

Figure 5:
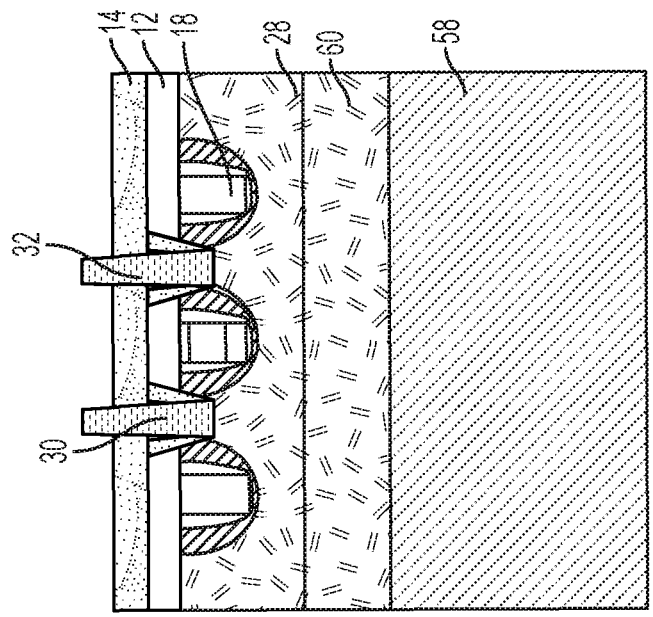

As shown in FIG. 5, the substrate 54 is then removed leaving the top device region attached to the handling wafer 58. Any conventional removing technique such as etching can be used. After removal the surface of the buried oxide layer 14 is exposed as well as a portion of the raised front-side source 30 and front-side drain 32.

Figure 6:
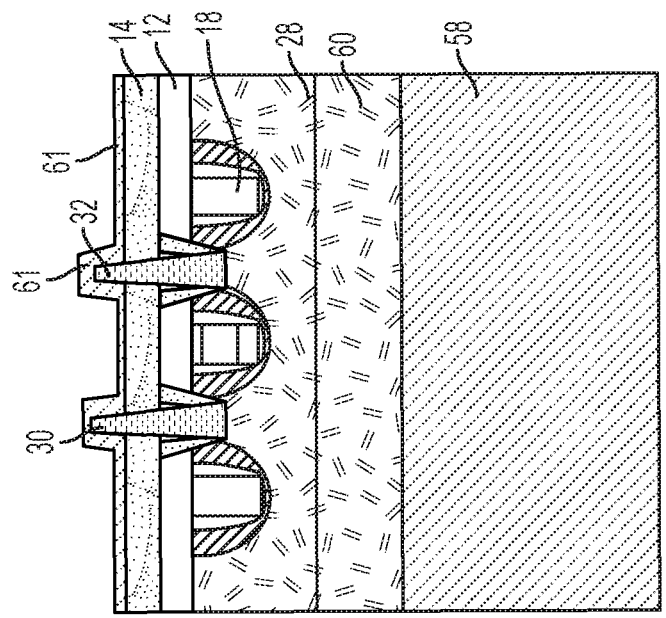
Figure 7:
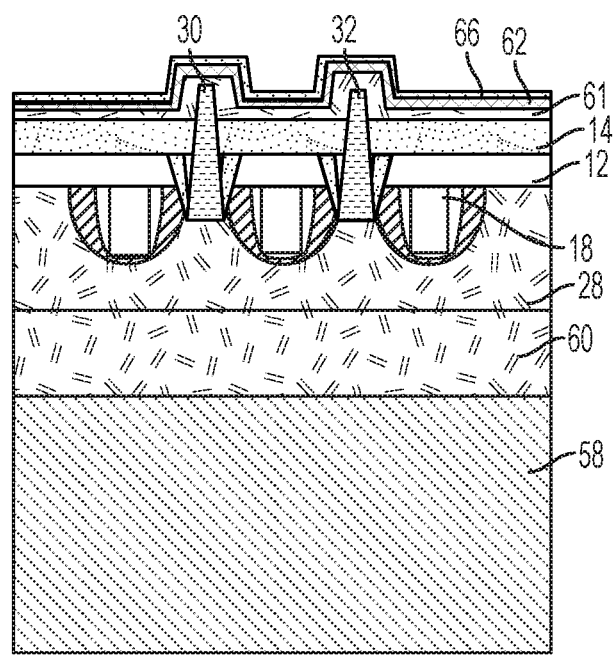

As shown in FIG. 6, a second dielectric layer 61 is formed over the exposed surface of the buried oxide layer 14, and the top and sidewall surfaces of the exposed portions of the front-side source 30 and front-side drain 32. The second dielectric layer 61 can be either low-k or high-k dielectric material. As shown in FIG. 7, a metal back-gate layer 62 is applied to the surface of the second dielectric layer 61. The metal back-gate layer 62 can be any suitable back-gate material. In an example, the metal back-gate layer 62 includes titanium nitride. Other examples for the metal back-gate layer 62 can include Ta, TaN, Nb, W, or multi-layers or alloys, such as $WN/RuO_2$. An additional coating 66 can be applied to the metal back-gate layer 62, such as an oxide layer that aids in protecting the metal back-gate layer 61 during the selective removal illustrated in FIG. 7.

Figure 8:
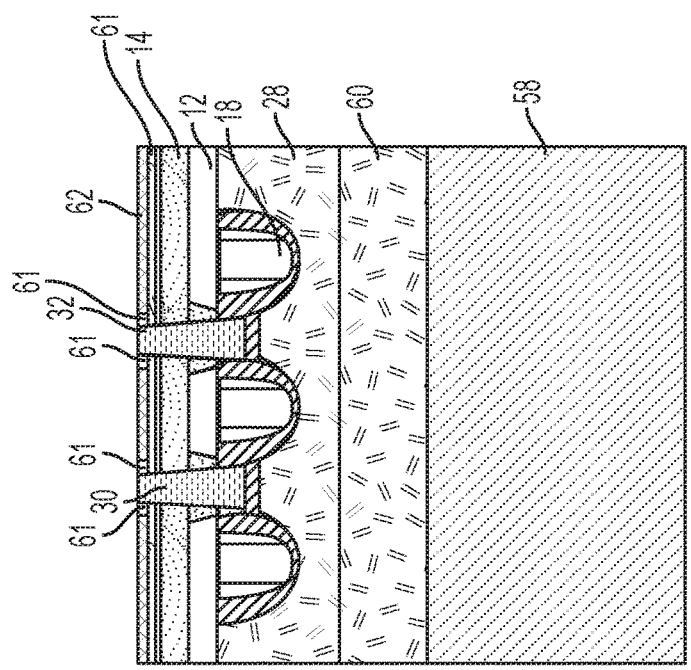

As shown in FIG. 8, the device up to this point is planarized, removing the second dielectric layer 61 from the top surface of the front-side source 30 and front-side drain 32, wherein the top surfaces of the front-side source 30 and front-side drain 32 are coplanar with the metal back-gate layer 61. The second dielectric layer 61 remaining after planarization contacts the sides of the front-side source 30 and front-side drain 32 such that the second dielectric layer 61 essentially is a spacer between the metal back-gate layer 62 and both the front-side source 30 and front-side drain 32.

Figure 9:
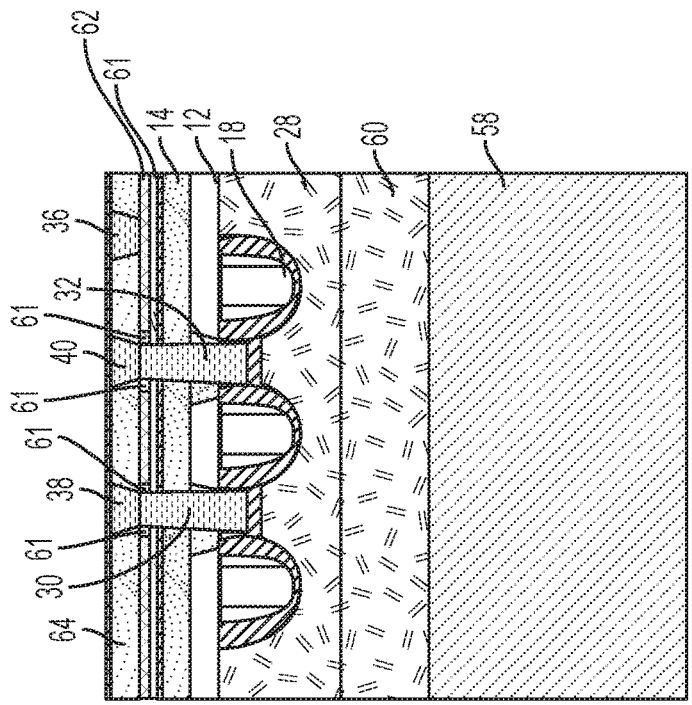

As shown in FIG. 9, a third dielectric layer 64 is applied to the top surface of the front-side source 30 and front-side drain 32, the remaining second dielectric layer 61, and the metal back-gate layer 62. Contact openings (vias) are made in the third dielectric layer 64. The contact openings are then filled with a metal to form a back-side source 38 and a back-side drain 40, wherein the back-side source 38 is aligned and in contact with the front-side source 30, wherein the back-side drain 38 is aligned and in contact with the front-side drain 21. In addition, a back-gate contact 36 is formed in the third dielectric layer 64, wherein the back-gate metal contact 36 is in contact with a portion of the back-gate metal layer 62. By essentially mirroring the front-side source/drain and the back-side source/drain, extrinsic capacitance can be reduced, and the source/drain contacts will not be confined to the limited space between the gates.

Figure 10:
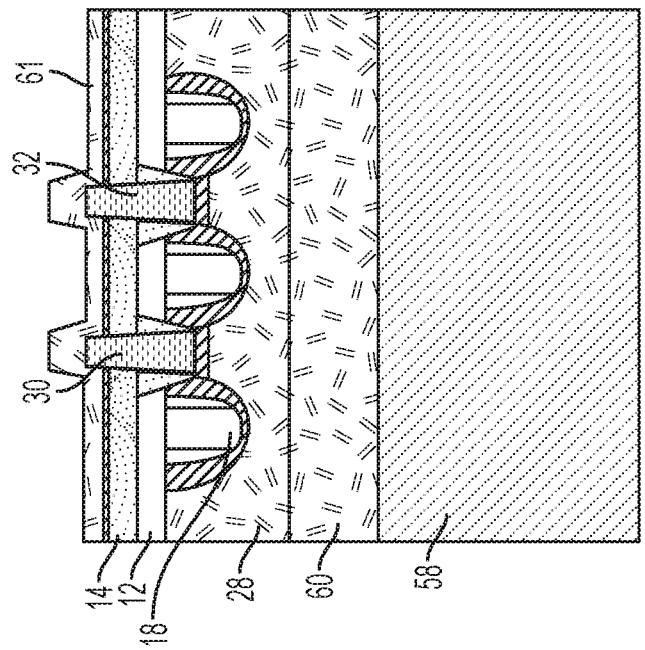

FIG. 10 through FIG. 13 illustrate an alternate portion of a fabrication process of a forming a semiconductor device according to an embodiment. FIG. 10 illustrates the point in the process wherein the substrate 54 is removed leaving the top device region attached to the handling wafer 58. After removal the surface of the buried oxide layer 14 is exposed as well as a portion of the raised front-side source 30 and front-side drain 32.

Figure 11:
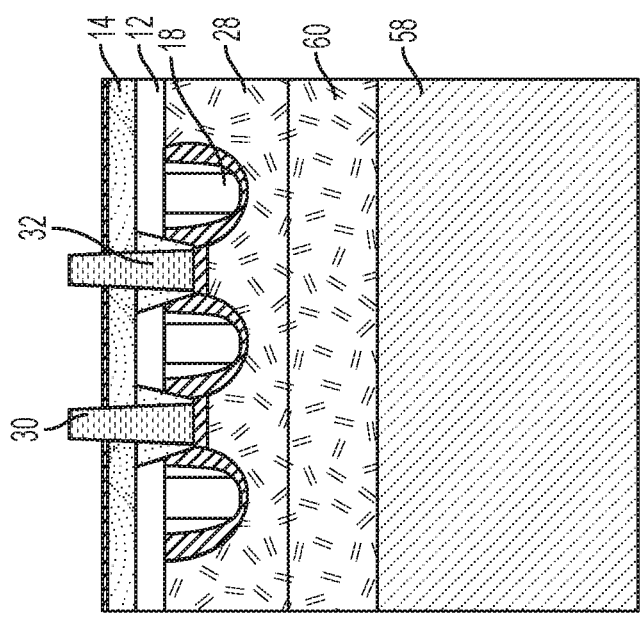

FIG. 11 illustrates the deposition of a second dielectric layer 61 over the exposed surface of the buried oxide layer 14, and the top and sidewall surfaces of the exposed portions of the front-side source 30 and front-side drain 32. The thickness of the second dielectric layer 61 can be between 10-15 nm. As shown in FIG. 12, a portion of the second dielectric layer 61 is selectively removed from the top surface of the buried oxide layer 14, a top surface of the front-side source 30, and the top surface of the front-side drain 32. The second dielectric layer 61 only remains contacting the sidewalls of the front-side source 30 and the front-side drain 32.

FIG. 13 illustrates the deposition of metal back-gate layer 62 is applied to the surface of the second dielectric layer 61, followed by the optional deposition of the coating layer 66. The method from this point continues on as illustrated and described above in FIGS. 7-9.

The use of a thicker layer of the second dielectric layer 61 provides for an increased space between the metal back-gate layer 62 and the exposed portions of the front-side source 30 and the front-side drain 32, which is advantageous when manufacturing the back-side source 38 and back-side drain 40 so as to provide a greater margin of possible error in the alignment of the exposed portion of the front-side source/drain and the back-side source/drain without shorting, compromising, or damaging the metal back-gate layer 62.

The disclosed semiconductor device and methods disclosed herein provide a decreased gate height that reduces capacitance, yet increases gate resistance, thereby favorably impacting performance of the device.

Although described herein the backside source, drain, and gate have been proposed, it is also possible to bond, flip, and continue on with processing of the frontside without making the backside source and drain. In other words, after the metal back gate is deposited, the backside source and drain are not created and instead further processing of the front side can be performed.

The first dielectric layer 28, the second dielectric layer 61, and the third dielectric layer 64 can independently be selected from, but not limited to, an oxide, nitride, oxynitride, silicates including metal silicates, aluminates, titanates, and nitrides. The first dielectric layer 28, the second dielectric layer 61, and the third dielectric layer 64 can independently include $SiO_2$, $HfO_2$, $ZrO_2$, $Al_2O_3$, $TiO_2$, $La_2O_3$, $SrTiO_3$, $LaAlO_3$, $Y_2O_3$, and combinations thereof. In an example, the first dielectric layer 28, the second dielectric layer 61, and the third dielectric layer 64 can independently include a nitride, such as silicon nitride.

FIGS. 14A-14B (note, FIG. 14B is a cross-section indicated by the line in FIG. 14A) and FIGS. 15A-15B (note, FIG. 15B is a cross-section indicated by the line in FIG. 15A) represent planar structures that can be formed from the method disclosed herein. FIGS. 14A and 15A illustrate a pFET backgate 82, an nFET backagate 84, backgate contacts 86, a source/drain contact 88, and gate 90. FIGS. 14B and 15B illustrate a seilf-aligned backgate 92 self-aligned source/drain regions 94, and a gate dielectric 96.

Generally pFET and nFET backgates should be separated, which requires a backside cut 80 in the backgate layer. The backgates are shown in dotted regions for pFET/nFET. If a cut is performed, the region can be filled with dielectric and then a backside contact to the frontside gate can be made in between the pFET and nFET as illustrated in FIGS. 14A-14B and 15A-15B. Alternatively, the frontside gate contact can be etched from the frontside through the buried oxide layer and can be revealed on the backside (similar to the source/drain case). The backgate contacts are shown in the corners and are generally less frequent (and can be shared between devices). Large backgate regions can be contacted outside of the region shown below. Ultimately, where the contacts are located will depend on if the device is continued to completion on the backside or flipped back to the frontside.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

For the sake of brevity, conventional techniques related to semiconductor device and IC fabrication cannot be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps have only been mentioned briefly herein or have omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the disclosed combination of operations and/or resulting structures of the present invention are unique. Thus, the unique combination of the operations described in connection with the present embodiments of the invention utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    a silicon-on-insulator layer adhered to a first surface of a buried oxide layer;
    at least one gate extending from the silicon-on-insulator layer;
    a first dielectric layer deposited over the at least one gate;
    a handling wafer adhered to the first dielectric layer;
    a front-side source and a front-side drain extending through a portion of the buried oxide layer and silicon-on-insulator layer;
    a second dielectric layer deposited on a second surface of the buried oxide layer and a surface of the front-side source and the front-side drain;
    a metal back-gate layer applied to the second dielectric layer, wherein the metal back-gate layer is not in contact with the front-side source and the front-side drain;
    a third dielectric layer deposited on the metal back-gate layer;
    a back-side source and a back-side drain extending through the second dielectric layer, wherein the back-side source is aligned and in contact with the front-side source, wherein the back-side drain is aligned and in contact with the front-side drain; and
    a metal back-gate contact extending through the third dielectric layer to a portion of the metal back-gate layer.

2. The semiconductor device of claim 1 wherein the front-side source and the front-side drain are independently filled with a metal selected from tungsten, cobalt ruthenium, nickel, titanium, silicide, or combinations thereof.

3. The semiconductor device of claim 1 wherein the back-side source and the back-side drain are independently filled with a metal selected from copper, tungsten, cobalt ruthenium, nickel, titanium, silicide, or combinations thereof.

4. The semiconductor device of claim 1 wherein the metal back-gate layer includes titanium nitride.

5. The semiconductor device of claim 1 further comprising a bonding layer between the first dielectric layer and the handling wafer.

6. The semiconductor device of claim 1 wherein the device includes gate spacers adjacent to the gate adjoining a gate conductor line.

7. A method of fabricating an upside-down field effect transistor, the method comprising:
   providing a donor substrate including a silicon substrate, a buried oxide, and a single-crystal silicon-on-insulator layer;
   forming a gate extending from the silicon-on-insulator layer;
   forming a front-side source and a front-side drain in the donor substrate by etching a portion of the donor substrate and filling the etched regions with a first metal;
   depositing and planarizing a first dielectric layer over the gate, the front-side source, and the front-side drain;
   adhering the dielectric layer to a handling wafer;
   selectively removing the donor substrate to expose the buried oxide layer, a portion of the front-side source, and a portion of the front-side drain;
   depositing a second dielectric layer over the exposed buried oxide layer, the exposed portion of the front-side source, and the exposed portion of the front-side drain;
   depositing a metal back-gate layer over the second dielectric layer;
   depositing a third dielectric layer over the metal back-gate layer, the exposed portion of the front-side source, and the exposed portion of the front-side drain;
   forming a back-side source and a back-side drain in the third dielectric layer, wherein the back-side source is aligned and in contact with the front-side source, wherein the back-side drain is aligned and in contact with the front-side drain; and
   forming a back-gate metal contact in the third dielectric layer, wherein the back-gate metal contact is in contact with a portion of the back-gate metal layer.

8. The method of claim 7 wherein the device includes gate spacers adjacent to the gate adjoining a gate conductor line.

9. The method of claim 7 wherein adhering the first dielectric layer to a handling wafer includes depositing a bonding film between the handling wafer and the first dielectric layer.

10. The method of claim 7 wherein the front-side source and the front-side drain are independently filled with a metal selected from tungsten, cobalt ruthenium, nickel, titanium, silicide, or combinations thereof.

11. The method of claim 7 wherein the back-side source and the back-side drain are independently filled with a metal selected from copper, tungsten, cobalt ruthenium, nickel, titanium, silicide, or combinations thereof.

12. The method of claim 7 wherein the metal back-gate layer includes titanium nitride.

13. The method of claim 7 further comprising a bonding layer between the first dielectric layer and the handling wafer.

14. A method of fabricating an upside-down field effect transistor, the method comprising:
   providing a donor substrate including a silicon substrate, a buried oxide, and a single-crystal silicon-on-insulator layer;
   forming a gate extending from the silicon-on-insulator layer;
   forming a front-side source and a front-side drain in the donor substrate by etching a portion of the donor substrate and filling the etched regions with a first metal;
   depositing and planarizing a first dielectric layer over the gate, the front-side source, and the front-side drain;
   adhering the first dielectric layer to a handling wafer;
   selectively removing the donor substrate to expose the buried oxide layer, a portion of the front-side source, and a portion of the front-side drain;
   depositing a second dielectric layer over the exposed buried oxide layer, the exposed portion of the front-side source, and the exposed portion of the front-side drain;
   selectively removing portions of the second dielectric layer to expose a surface of the buried oxide layer, a top surface of the front-side source, and a top surface of the front-side drain, wherein the second dielectric layer remains in contact with a sidewall of the front-side source and a sidewall of the front-side drain;
   depositing a metal back-gate layer over the second dielectric layer;
   depositing a third dielectric layer over the metal back-gate layer, the exposed portion of the front-side source, and the exposed portion of the front-side drain;
   forming a back-side source and a back-side drain in the third dielectric layer, wherein the back-side source is aligned and in contact with the front-side source, wherein the back-side drain is aligned and in contact with the front-side drain; and
   forming a back-gate metal contact in the third dielectric layer, wherein the back-gate metal contact is in contact with a portion of the back-gate metal layer.

15. The method of claim 14 wherein adhering the first dielectric layer to a handling wafer includes depositing a bonding film between the handling wafer and the first dielectric layer.

16. The method of claim 14 wherein adhering the first dielectric layer to a handling wafer includes depositing a bonding film between the handling wafer and the first dielectric layer.

17. The method of claim 14 wherein the front-side source and the front-side drain are independently filled with a metal selected from tungsten, cobalt ruthenium, nickel, titanium, silicide, or combinations thereof.

18. The method of claim 14 wherein the back-side source and the back-side drain are independently filled with a metal selected from copper, tungsten, cobalt ruthenium, nickel, titanium, silicide, or combinations thereof.

19. The method of claim 14 wherein the metal back-gate layer includes titanium nitride.

20. The method of claim 14 further comprising a bonding layer between the first dielectric layer and the handling wafer.

* * * * *